Figure 1:
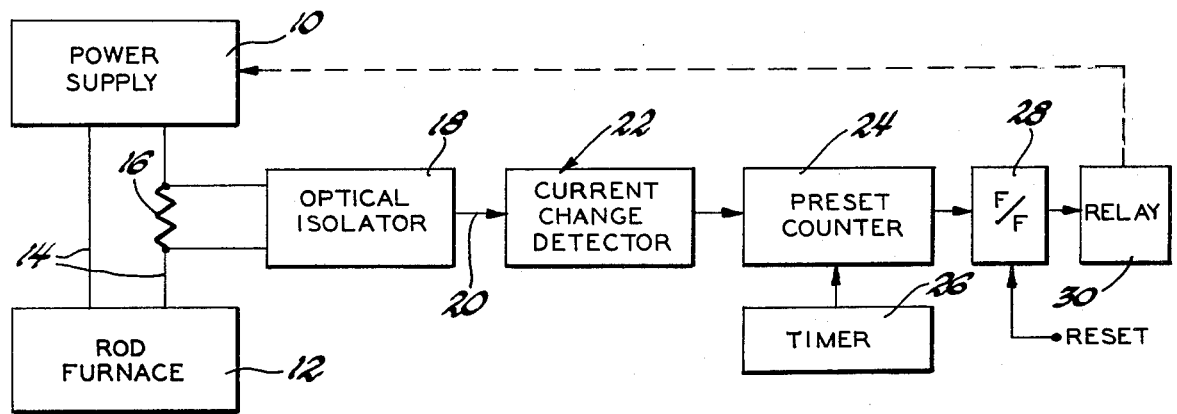

United States Patent [19]

Renn et al.

[11] 4,376,243

[45] Mar. 8, 1983

[54] ARC DETECTOR FOR ELECTRIC ROD FURNACE

[75] Inventors: Charles F. Renn; William J. Koeller, both of Defiance, Ohio

[73] Assignee: General Motors Corporation, Detroit, Mich.

[21] Appl. No.: 228,293

[22] Filed: Jan. 26, 1981

[51] Int. Cl.³ .............................................. H05B 1/02
[52] U.S. Cl. .................... 219/514; 219/519; 219/507; 219/492; 361/93; 361/235; 340/650; 373/102
[58] Field of Search .............. 219/490, 492, 497, 507, 219/508, 509, 514, 518, 519, 502; 361/92, 235, 5; 13/12, 13; 340/146.34, 168 B, 650, 664; 373/102, 104

[56] References Cited

U.S. PATENT DOCUMENTS

| | | | |
|---|---|---|---|
| 3,295,441 | 1/1967 | Garnier | 361/5 X |
| 3,659,114 | 4/1972 | Polenz et al. | 13/12 |
| 3,662,143 | 5/1972 | Davis | 219/69.5 |
| 3,775,675 | 11/1973 | Freeze et al. | 324/51 |
| 3,795,839 | 3/1974 | Walberg | 361/235 |
| 3,925,773 | 12/1975 | Green | 340/258 A |
| 3,989,999 | 11/1976 | Thompson et al. | 13/12 |
| 4,058,804 | 11/1977 | Sawada et al. | 340/248 A |
| 4,075,677 | 2/1978 | Bentley | 361/93 |
| 4,086,574 | 4/1978 | Miyabe | 340/227 R |
| 4,208,692 | 6/1980 | Rohr | 361/93 |
| 4,297,741 | 10/1981 | Howell | 361/93 |

Primary Examiner—M. H. Paschall
Attorney, Agent, or Firm—Warren D. Hill

[57] ABSTRACT

A current shunt in the power supply to an electric furnace generates a signal voltage proportional to furnace current. A voltage rate comparator senses a high change rate of signal level corresponding to arcs occurring in the furnace and the comparator output pulse is fed to a preset counter. The counter is reset periodically. If a predetermined number of pulses are registered by the counter within a preset time interval, the counter output will de-energize an output relay which turns the power supply off and energizes a warning signal.

3 Claims, 3 Drawing Figures

ARC DETECTOR FOR ELECTRIC ROD FURNACE

This invention relates to an electric rod furnace arc detector and more particularly to such a detector comprising a digital circuit for sensing arcing in the furnace and controlling the furnace power supply.

In an electrical rod furnace a large carbon rod is supported by water cooled copper holders which are biased against the carbon rod and which serve as the electrical connection to a DC power source. Current on the order of 10,000 amperes is passed through the carbon rod via the water cooled holders. Deterioration of the contact between the holders and the rod can occur to allow arcing which becomes progressively greater until the copper holder is destroyed by the heat generated in the arc. It is desirable, therefore, to reliably detect the arc and turn off the furnace power supply very quickly to prevent damage. It is required to operate in an environment which contains much electrical noise and, therefore, must be able to respond to the occurrence of the arc at the rod and ignore interference.

It is, therefore, a general object of this invention to provide a rod furnace arc detector which detects arcing in the furnace quickly enough to initiate corrective measures before substantial damage occurs. It is a further object to provide such an apparatus which is non-responsive to electrical noise occurring in the furnace environment.

The invention is carried out by a circuit responsive to current surges for producing a pulse when the current exceeds a set value, a preset counter counting the pulses and producing an output signal when the preset count is obtained, a timer for periodically resetting the counter so that the output signal can occur only when the preset number of counts occurs within the preset time interval, and an output circuit responsive to the output signal. The invention further includes such an apparatus wherein the output circuit controls the power supply to prevent further arcing.

Figure 2A:
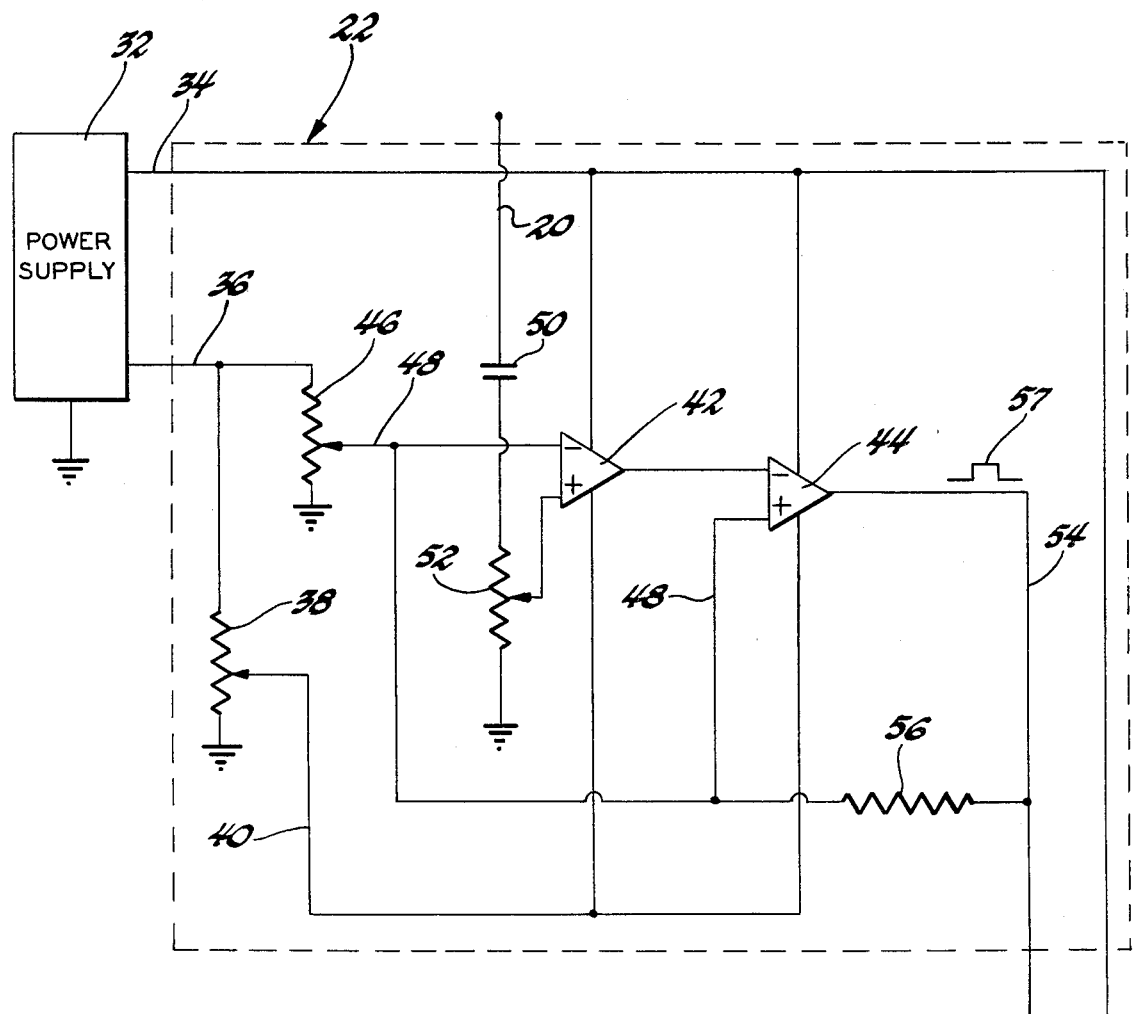
Figure 2A:
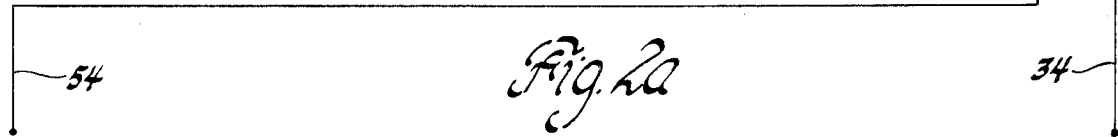
Figure 2B:
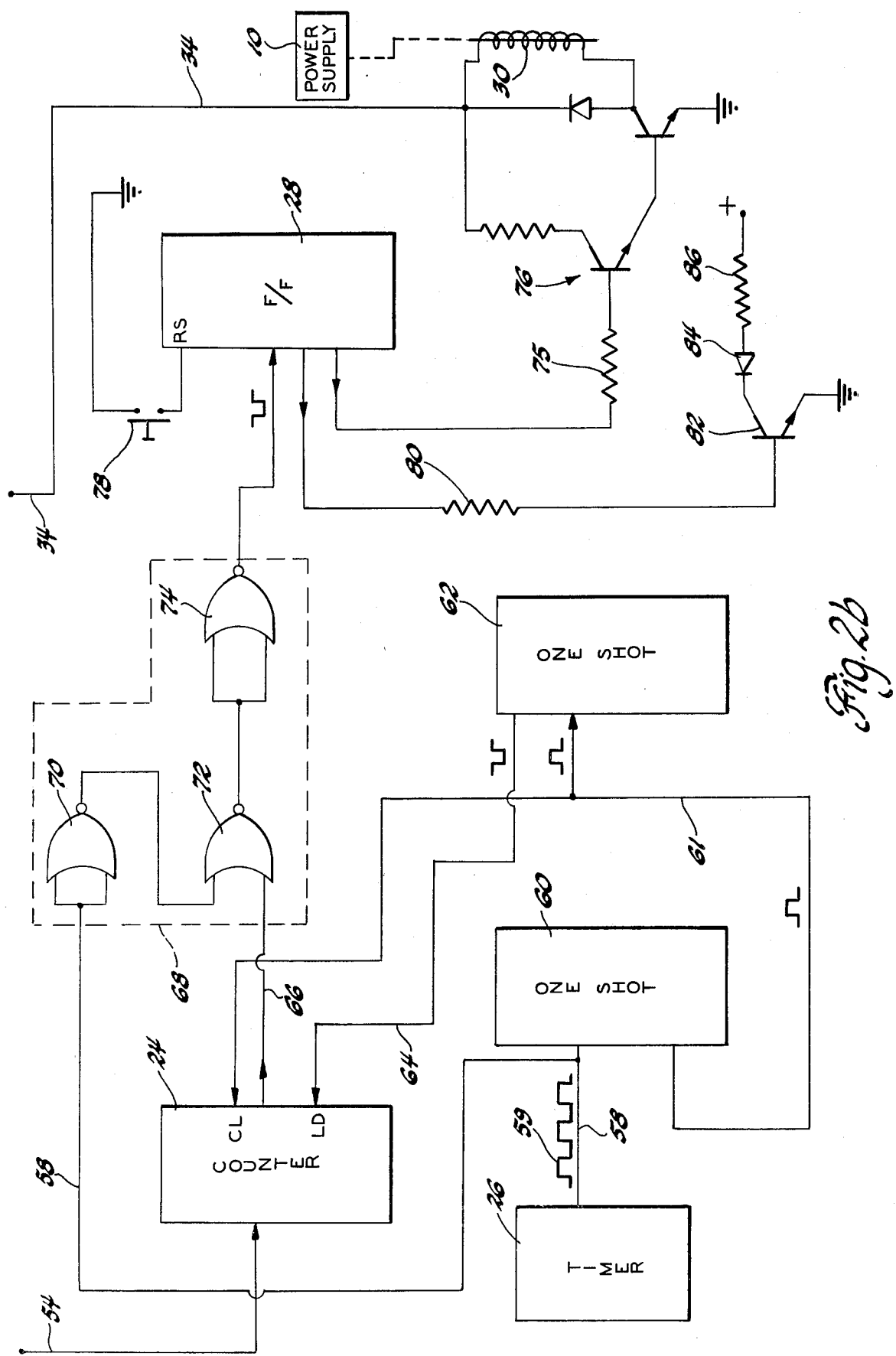

The above and other advantages will be made more apparent from the following specification taken in conjunction with the accompanying drawings wherein like reference numerals refer to like parts and wherein:

FIG. 1 is a block diagram of a rod furnace arc detection apparatus according to the invention, and FIGS. 2a and 2b together are a schematic electrical diagram of the arc detection apparatus of FIG. 1.

Referring to FIG. 1, a power supply 10 provides current to the rod furnace 12 via buses 14. The power supply output is nominally 10,000 amperes and is regulated to maintain a constant power to the rod at 650 kilowatts. The energy is dissipated in the carbon rod to furnish the heat to the furnace. Arcing of this current can occur due to poor contact between the carbon rod and water cooled holders. The arcing results in repetitive high current pulses or surges. The current to the rod is sensed by a 10,000 ampere shunt 16 in one of the buses 14 which supplies a 0 to 50 millivolt signal proportional to furnace current to an optical isolator 18. The optical isolator output ranges from 0 to −2.5 volts and is proportional to the furnace current. It is supplied on line 20 to the current change detector 22. That detector 22 differentiates the signal voltage and produces a square wave arc pulse whenever a signal rate of change exceeds a preset threshold. A counter 24 preset to a count of 3 is controlled by a timer 26 which is periodically resets the counter to allow 1.5 second sample periods. The counter receives the arc pulses from the detector 22 so that if the counter receives three pulses within a 1.5 second sample period, the counter will produce a counter signal to set a flip-flop 28 to an "on" state which activates a relay 30. The flip-flop latches in the "on" state to maintain energization of the relay until the flip-flop is manually reset. The relay, in turn, is connected to the furnace power supply 10 to turn off the power supply thereby preventing further arcing and the destruction of the rod holders.

The details of the arc detection circuit are shown in FIGS. 2a and 2b wherein the power supply 32 for the electronic controls produces a +12 volts on line 34 and a −12 volts on line 36. The supply lines serve as power inputs to the current change detector 22. That detector includes a potentiometer 38 connected between line 36 and ground and having a movable tap set at −1.4 volts and connected to a line 40. A pair of operational amplifiers 42 and 44 are connected between lines 34 and 40 at their voltage supply terminals. A second potentiometer 46 has its resistor connected to line 36 and ground and its variable tap connected to line 48 and set at a threshold voltage which is connected to the negative input terminal of amplifier 42 and the positive input terminal of the amplifier 44. Line 20 carrying the signal from the optical isolator 18 is connected to ground through a small differentiating capacitor 50 in series with the resistor of a potentiometer 52 which has its variable tap connected to the positive input terminal of the operational amplifier 42. The output of that amplifier is connected to the negative input terminal of the amplifier 44. Its output comprising the arc pulses on line 54 is connected by a feedback resistor 56 to the line 48. Thus, this circuit comprises a level detector set to produce a saturated square wave output pulse or arc pulse 57 on line 54 whenever the input signal on line 20 increases at a given rate determined by the setting of the potentiometers 52 and 46. Slow changes of current in the rod furnace will not trigger the detector 22, however, the sudden changes attributable to arcing will be sufficient to trigger arc pulses 57 from the detector, one pulse for each arc event.

The pulse on line 54 is fed to the preset counter 24. The timer 26 produces a train of on and off (reset) pulses 59 having respective logic values of "one" for 1.5 seconds and "zero" for 0.3 seconds. That train of pulses 59 on line 58 is connected to an input of a one shot 60 which at the beginning of an off period produces a pulse on line 61 connected to a clear terminal of the counter 24. The line 61 is also connected to the input of another one shot 62 which after a short time delay produces an output signal which is connected by line 64 to a load terminal of the counter and is effective to preset the counter at a down count of 3. That is, when three arc pulses are received on line 54, the counter 24 counts up from its preset state to a zero state and produces an output or counter signal on line 66 which is connected to a blanking circuit 68.

The blanking circuit comprises three NOR gates. The first NOR gate 70 has both inputs connected to the line 58 containing the timer output signals and serves as an inverter. The output of that gate is connected to one input of the NOR gate 72 and the counter output 66 is connected to the other input of NOR gate 72. The output of NOR gate 72 is connected to both inputs of NOR gate 74 which therefore acts as an inverter. The effect of the blanking circuit 68 is to block any pulses on line 66 from the counter during the clear and preset operation. That is, when the reset pulse on line 58 is at zero level, the zero input into the gate 70 results in a one output which is fed into the gate 72 thereby making the gate non-responsive to any signals on the counter output line 66. This avoids the problem of any spurious output signals which can occur through the clearing and resetting operation during the 0.3 second off cycle of the timer. When, however, the timer is on for the 1.5 second sample period, the output of the NOR gate 70 is at a zero level so that the outputs of the gates 72 and 74 are then responsive to every change in the signal on line 66.

The output of the blanking circuit 68 or counter signal is fed to an input of the flip-flop 28 which has an output connected through a resistor 75 to a Darlington pair 76 serially connected with the relay 30 to control current flow from the line 34 through the coil of relay 30. The relay is energized whenever the output of counter 24 is passed to the flip-flop 28 causing a change of state in the flip-flop which energizes the Darlington pair. The relay 30 is connected to the power supply 10 to turn off the current flow to the furnace 12. The flip-flop latches in the new state and maintains the relay energized until the flip-flop is manually reset. A manually controlled switch 78 connected between a flip-flop reset terminal and ground is effective when actuated to restore the flip-flop to its de-energized state thereby deactivating the relay 30.

Another output of the flip-flop 28 is connected through a resistor 80 to the base of a resistor 82. The emitter-collector circuit of the transistor 82 is connected in series with a light emitting diode 84 and a resistor 86 between a voltage source and ground. By this circuit the flip-flop output can cause illumination of the LED 84 to warn of an arcing condition.

It will thus be seen that the detector circuit is comprised of an analog detector 22 producing a pulsed or digital output which is fed into a digital circuit comprising a counter, a timer and a flip-flop as its major components for responding rapidly to repetitive arcing and at the same time rejects the noise associated with an electric rod furnace which can produce an occasional pulse large enough to trigger the detector 22 but lacking the repetitive pattern necessary to run out the counter 24 in the interval fixed by the timer 26.

The embodiments of the invention in which an exclusive property or privilege is claimed are defined as follows:

1. Apparatus for detecting repetitive arcing in an electric furnace supplied by an electrical direct current source wherein an electrical current surge accompanies each arc event comprising
    detector means responsive to surges in the direct current flow for producing an arc pulse each time the current change exceeds a predetermined rate,
    a counter preset for a given count and connected to the detector means to count each arc pulse for producing a counter signal when the counter reaches the said given count,
    timer means for producing a regular series of reset pulses defining predetermined sample periods, the reset pulses being coupled to the counter to reset the counter at the occurrence of each reset pulse so that the counter is able to reach the given count only when the required number of arc pulses occurs within a single sample period, and
    output circuitry for producing an output when the counter produces a counter signal.

2. Apparatus for detecting and stopping repetitive arcing in an electric rod furnace supplied by an electrical direct current source wherein an electrical current surge accompanies each arc event comprising
    means sensing the direct current flow to the furnace and generating an electrical signal substantially proportional thereto,
    detector means responsive to surges in the signal for producing an arc pulse each time the signal change exceeds a predetermined rate,
    a counter preset for a given count and connected to the detector means to count each arc pulse for producing a counter signal when the counter reaches the said given count,
    timer means for producing a regular series of reset pulses defining predetermined sample periods, the reset pulses being coupled to the counter to reset the counter at the occurrence of each reset pulse so that the counter is able to reach the given count only when the required number of arc pulses occurs within a single sample period, and
    output circuitry coupled to the current source of turning off the current when the counter produces a counter signal.

3. Apparatus for detecting and stopping repetitive arcing in an electric rod furnace supplied by an electrical direct current source wherein an electrical current surge accompanies each arc event comprising
    detector means responsive to surges in the direct current flow for producing an arc pulse each time the current change exceeds a predetermined rate,
    a counter preset for a given count and connected to the detector means to count each arc pulse for producing a counter signal when the counter reaches the said given count,
    timer means for producing a regular series of reset pulses defining predetermined sample periods, the reset pulses being coupled to the counter to reset the counter at the occurrence of each reset pulse so that the counter is able to reach the given count only when the required number of arc pulses occurs within a single sample period, and
    output circuitry including a latch means for producing a continuous output for energizing a relay when the counter produces a counter signal,
    the relay being coupled to the current source to turn off the current upon relay energization.

* * * * *